(12) United States Patent
Asous et al.

(10) Patent No.: US 6,483,615 B1
(45) Date of Patent: Nov. 19, 2002

(54) PROCESS FOR SELECTING OPTICAL SOURCES FOR COMMUNICATION SYSTEM

(75) Inventors: Waleed A. Asous, Allentown, PA (US); Robert L. Hartman, Warren Township, NJ (US); Padman Parayanthal, Clinton Township, NJ (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/156,072

(22) Filed: Sep. 17, 1998

(51) Int. Cl.[7] .................. H04B 10/08; H04B 10/00; H04B 10/12
(52) U.S. Cl. ............... 359/110; 359/159; 359/161; 359/173
(58) Field of Search .................. 359/110, 159, 359/161, 173, 188

(56) References Cited

U.S. PATENT DOCUMENTS

| | | | |
|---|---|---|---|
| 4,953,156 A | * 8/1990 | Olshansky et al. | 370/3 |
| 5,506,716 A | * 4/1996 | Mihara et al. | 359/152 |
| 5,825,530 A | * 10/1998 | Leckel et al. | 359/333 |
| 5,995,261 A | * 11/1999 | Asous | 359/163 |
| 6,026,105 A | * 2/2000 | Sheridan-Eng | 372/43 |

OTHER PUBLICATIONS

"Modulation Induced Transcient Chirping In Single Frequency Lasers" by Richard A. Linke; 1985 IEEE Journal of Quantum Electronics, vol. QE–21, No. 6, pp. 593–597.

"Analysis of Laser Phase Noise to Intensity Noise Conversion by Chromatic Dispersion in Intensity Modulation and Direct Detection Optical–Fiber Transmission" by Shu Yamamoto, et al.; 1990 IEEE Journal of Lightwave Technology, vol. 8, No. 11, pp. 1716–1722.

* cited by examiner

Primary Examiner—Leslie Pascal
Assistant Examiner—M. R. Sedighian
(74) Attorney, Agent, or Firm—Steve Mendelsohn

(57) ABSTRACT

Optical sources, such as electro-absorption modulator isolated laser modules (EMILMs), for fiber optical communication systems are selected based on noise measures made outside—and preferably substantially outside—of the communication system's operational bandwidth. In one embodiment, EMILM devices are selected for communication systems having path lengths of 640 km or more based on both the chirp of the devices and the relative intensity noise (RIN) of the devices at the relaxation oscillation frequency $F_r$. Devices having both low chirp and low RIN at $F_r$ are more likely to meet bit error rate requirements than are devices selected solely for low chirp.

3 Claims, 5 Drawing Sheets

PROCESS FOR SELECTING OPTICAL SOURCES FOR COMMUNICATION SYSTEM

BACKGROUND OF THE INVENTION

1. Field of the Invention

The present invention relates to fiber optical communication systems, and, in particular, to the selection of optical sources for such systems.

2. Description of the Related Art

Fiber optical communication systems typically have optical sources, such as semiconductor lasers, that convert information-bearing electrical signals into modulated light for transmission along optical fibers to remote optical receivers that convert the light signals back into electrical signals for further processing (e.g., conversion into sound at a telephone). One or more optical amplifiers may be placed along a given transmission path between an optical source and a corresponding optical receiver. These optical amplifiers boost the light signals that become attenuated during transmission along an optical fiber. Optical amplifiers are used to increase the total distance between an optical source and an optical receiver.

Every element in a transmission path, including the optical source, the optical amplifiers, and the optical fibers themselves, introduces some degree of noise and/or pulse distortion into the light signals. When noise or distortion gets sufficiently large, bit errors will be introduced into the digital information carried by the modulated light signals. The frequency with which these bit errors occur (i.e., the bit error rate (BER)) is a useful measure of the quality of the transmission process. The higher the BER, the lower the quality. Although some of these bit errors may be corrected using auto-correction algorithms implemented at the optical receiver, at some point, the optical receiver will not be able to accurately recover the data with 100% accuracy and information will be lost.

One way to increase the total length of an optical transmission path without exceeding an unacceptable BER level (i.e., the BER floor) is to use a high-quality optical source. Higher quality optical sources introduce less noise into the optical path, thereby allowing more optical amplifiers to be placed in the optical path without reaching the BER floor, thereby enabling a longer transmission path.

Conventionally, chirp testing has been applied to characterize the quality of individual optical sources to determine their acceptability for different types of applications. The chirp of an optical source is defined as the variation in wavelength of a light signal generated by the optical source. The lower the variation, the lower the chirp. In the past, test measurements of the chirp of optical sources have been used to determine the acceptability of optical sources for applications with longer transmission paths and/or lower BER requirements, with optical sources having low chirp being selected for such applications.

Another way to characterize the quality of optical sources is to perform BER testing in which an entire optical transmission path from an optical source to an optical receiver is tested, including the optical fibers and any intervening optical amplifiers. Such testing of the entire optical transmission path greatly increases the cost and complexity of characterizing the quality of optical sources.

Currently, dense wavelength division multiplexed (DWDM) systems are becoming the preferred method for expanding the information capacity on existing single-mode fibers. For systems at 2.5 Gigabits per second (Gb/s), the number of channels has recently increased from 8 to 80, and the channel spacing has decreased from 200 Gigahertz (GHz) to 50 GHz, with plans to increase the transmission capacity by further decreasing the channel spacing. Commercial fiber systems are being planned to transmit data without regeneration on non-dispersion shifted fibers along transmission paths having a total length of up to 640 km. Such systems require optical sources, such as electro-absorption modulator isolated laser modules (EMILMs), with high quality and high reliability at an increasing number of wavelengths in the range of 1.55 micrometers ($\mu$m). Conventional chirp testing alone has not proven to be an acceptable method for selecting EMILM devices for such applications. In particular, EMILM devices with relatively low chirp have been found to produce unacceptably high BER levels at transmission path lengths of 640 km.

SUMMARY OF THE INVENTION

The present invention is directed to a process for selecting optical sources, such as EMILM devices, for use in optical transmission systems, especially those with long transmission paths and/or low BER requirements. In particular, the present invention involves the application of specific noise testing to the optical sources, preferably in conjunction with conventional chirp testing, to characterize the acceptability of the optical sources for different applications. The specific noise testing involves characterizing the noise level in the light signals generated by an optical source for frequencies outside of bandwidth of the system in which the optical source will operate. For example, this noise testing may involve measuring the relative intensity noise (RIN) of the optical source at the relaxation oscillation frequency $F_r$. RIN is the average noise power divided by the average power of the optical source at a given frequency. $F_r$ is the frequency that corresponds to the inherent peak noise for the optical source when operated in an unmodulated mode (e.g., continuous wave). The measured RIN may then be used to determine the acceptability of the optical device for different applications. The inventors have found that optical devices should have both low chirp and low RIN at $F_r$ to be acceptable for fiber optical communication systems having long transmission paths, e.g., up to 640 km or even higher.

In one embodiment, the present invention is a method for selecting optical sources for use in a fiber optical communication system having an operating bandwidth, comprising the steps of (a) characterizing a plurality of optical sources with respect to a noise measure at a frequency outside of the operating bandwidth of the communication system to determine a noise measure level for each optical source; and (b) selecting one or more of the optical sources for use in the communication system based on the corresponding noise measure levels.

In an alternative embodiment, the present invention is a fiber optical communication system having an operating bandwidth, comprising one or more transmission paths, each transmission path comprising an optical source and an optical receiver with two or more optical fibers separated by one or more optical amplifiers between the optical source and the optical receiver, wherein, for each transmission path, the optical source has a noise measure level at a frequency outside of the operating bandwidth of the communication system that is below a specified threshold level.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

According to certain embodiments of the present invention, the acceptability of optical sources, such as electro-absorption modulator isolated laser modules, for use in a specific optical transmission system is characterized based on at least the following two different measurements: (1) the chirp of the optical sources and (2) a noise measure at a frequency outside of the operating bandwidth of the optical transmission system. FIGS. A and B show block diagrams of test configurations for these two measures.

Figure 1:
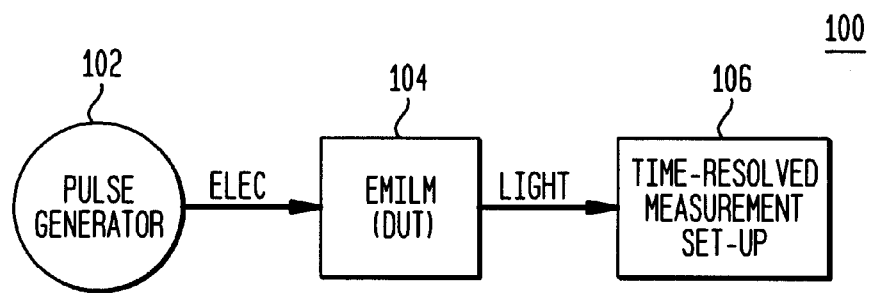
FIG. 1 shows a block diagram of a test configuration used to measure the chirp of optical sources based on time-resolved spectroscopy, according to one embodiment of the present invention.

FIG. 1 shows a block diagram of a test configuration 100 used to measure the chirp of optical sources based on time-resolved spectroscopy, according to one embodiment of the present invention. As shown in FIG. 1, pulse generator 102 generates an electrical signal corresponding to a continuous pulse train and the device under test 104 (i.e., an optical source) converts the electrical signal into a light signal. The light signal is received at a time-resolved measurement set-up 106, which characterizes the chirp of optical source 104. Set-up 106 may comprise (a) a wavelength discriminator which selects a specific band of light and converts the selected light energy into an electrical signal, (b) a high-speed scope which differentiates the electrical signal, and (c) a computer which determines the chirp of the optical device from the differentiated signal. Chirp testing is further described in "Modulation Induced Transient Chirping in Single Frequency Lasers," by Richard A. Linke, IEEE Journal of Quantum Electronics, Vol. QE-21, June 1985, the teachings of which are incorporated herein by reference.

Figure 2:
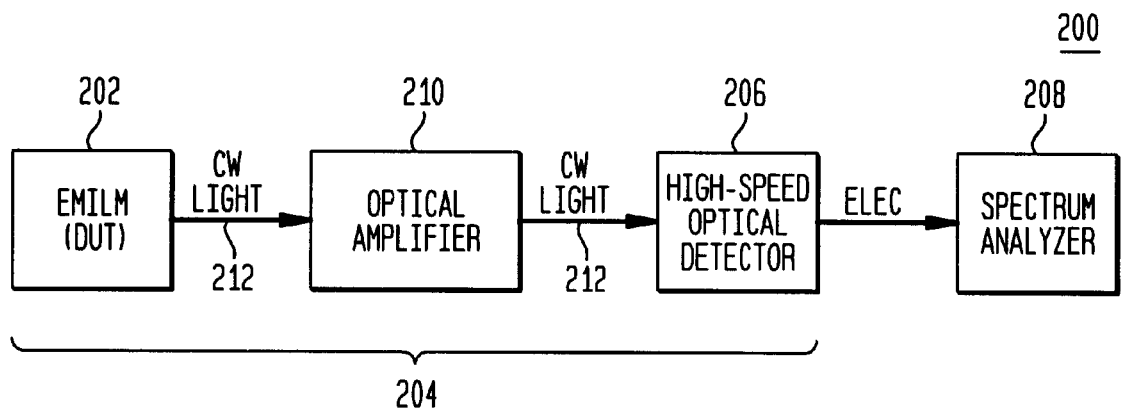
FIG. 2 shows a block diagram of a test configuration used to characterize optical sources with respect to a noise measure at a frequency outside of the operating bandwidth of the optical transmission system, according to one embodiment of the present invention.

FIG. 2 shows a block diagram of a test configuration 200 used to characterize optical sources with respect to a noise measure at a frequency outside of the operating bandwidth of the optical transmission system, according to one embodiment of the present invention. As shown in FIG. 2, optical source 202 is operated in an unmodulated mode to generate continuous-wave (CW) light energy that is transmitted over an optical transmission path 204 and converted by a high-speed optical detector 206 into an electrical signal that is analyzed by a spectrum analyzer 208. Depending on the particular implementation of test configuration 200, the length of optical transmission path 204 may be anywhere from 0 km to a relatively long distance (e.g., over 640 km). As used in this specification, a path length of 0 km refers to an optical transmission path that is short enough (e.g., less than a few meters) to be said to be approximately 0 km long. Optical transmission path 204 may include one or more optical amplifiers 210 connecting pairs of optical fibers 212 to simulate the transmission path of an actual optical transmission system.

In one embodiment of the present invention, the noise measure is the relative intensity noise (RIN) of the optical source measured at the relaxation oscillation frequency $F_r$. For applications in which the optical sources are being tested for eventual use in optical transmission paths having lengths of 640 km or even higher, noise-level testing with configuration 200 of FIG. 2 may be applied only to those optical sources that have already been characterized as having a sufficiently low chirp level (e.g., less than 0.2 Angstroms peak-to-peak) based on chirp testing implemented using configuration 100 of FIG. 1.

A semiconductor optical source, such as an EMILM device, generates intensity and phase noise. In the presence of particularly large dispersion at 1.55 µm in single-mode fibers, both types of noise can be transformed from very high frequencies (e.g., those outside the receiver band) to relatively low frequencies (e.g., those within the frequency band). This mechanism degrades the signal-to-noise ratio of the received signal, which, in some cases, results in significant system degradation, especially if the noise of the optical source is large.

In the case of EMILM devices, the laser section of the integrated device is not modulated during noise testing. The importance of the device's noise characteristics at very high frequencies has not been recognized in the literature nor has it been incorporated into the device specifications. The receiver noise components in fiber optical communication systems are usually specified only up to approximately 0.7 times the bit rate. Consequently, the noise of the optical sources has only been specified within the receiver bandwidth. For example, at a bit rate of 2.5 Gb/s, the noise of the optical source is typically specified only up to approximately 2 GHz. The maximum noise of a semiconductor laser, at relatively high current levels (e.g., more than three times the threshold current for the semiconductor laser), occurs at the relaxation oscillation frequency $F_r$, which is normally at a very high frequency (e.g., from about 6 GHz to about 15 GHz).

Conventional wisdom has been that the noise at such high frequencies does not contribute to system degradation, particularly at 2.5 Gb/s for directly or externally modulated laser sources. Nevertheless, the inventors have discovered and verified the importance of noise at these very high frequencies, particularly for fiber optical communication systems designed for very long distances such as 640 km. The inventors have also observed that the noise peak frequency at the receiver shifts to lower frequency as the fiber length increases.

Figure 3:
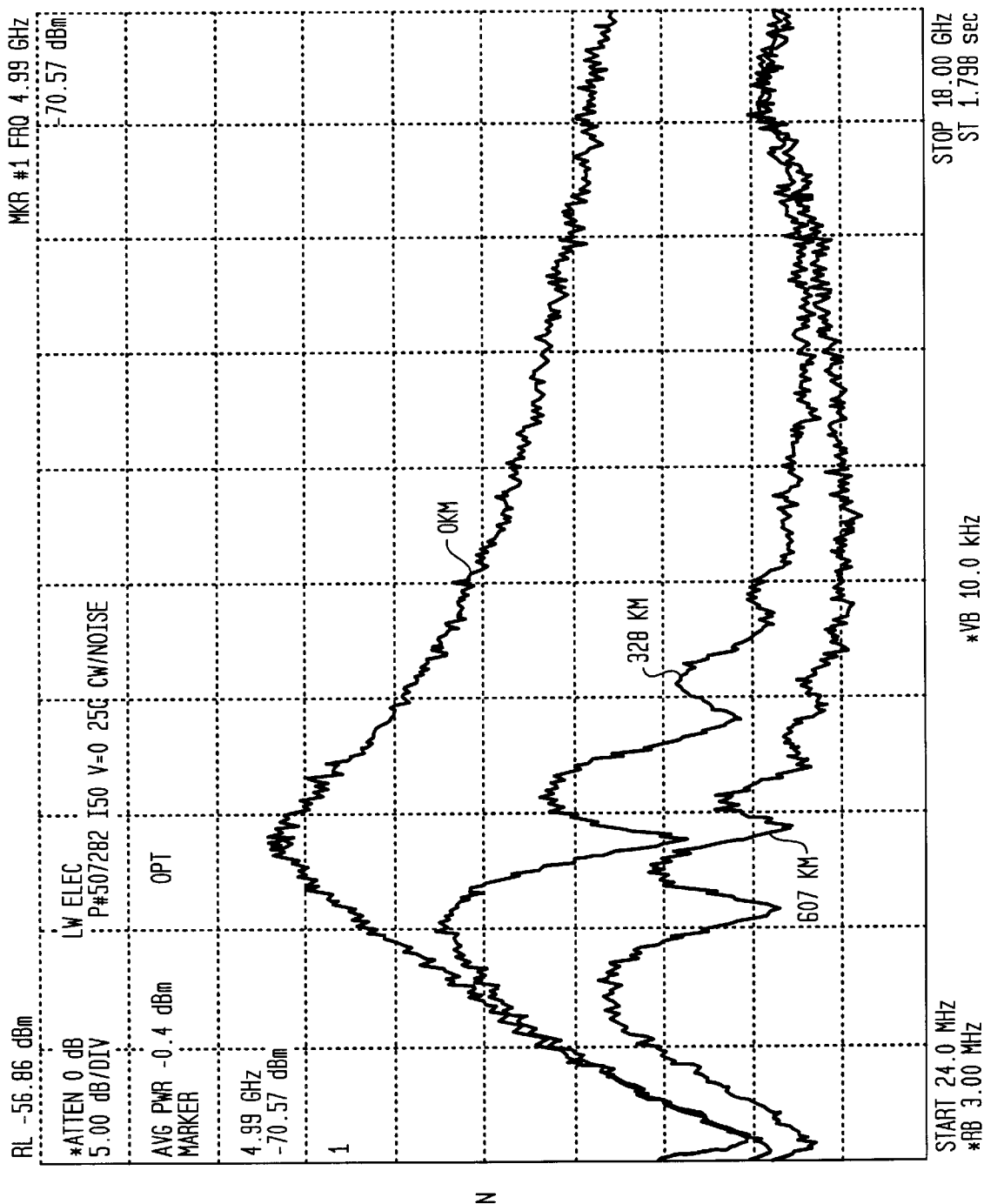
FIG. 3 shows a graphical representation of the RIN level for an EMILM device as a function of frequency for three different transmission path lengths (0 km, 328 km, and 607 km)

FIG. 3 shows a graphical representation of the RIN level for an EMILM device as a function of frequency for three different transmission path lengths (0 km, 328 km, and 607 km). As shown in FIG. 3, the noise peak moves downward from about 5 GHz at 0 km to about 3.7 GHz at 328 km, and to about 2.6 GHz at 607 km. In addition, if the level of the peak noise of the optical source increases, then the level of the peak noise of the received signal also increases for a given path length.

Figure 4:
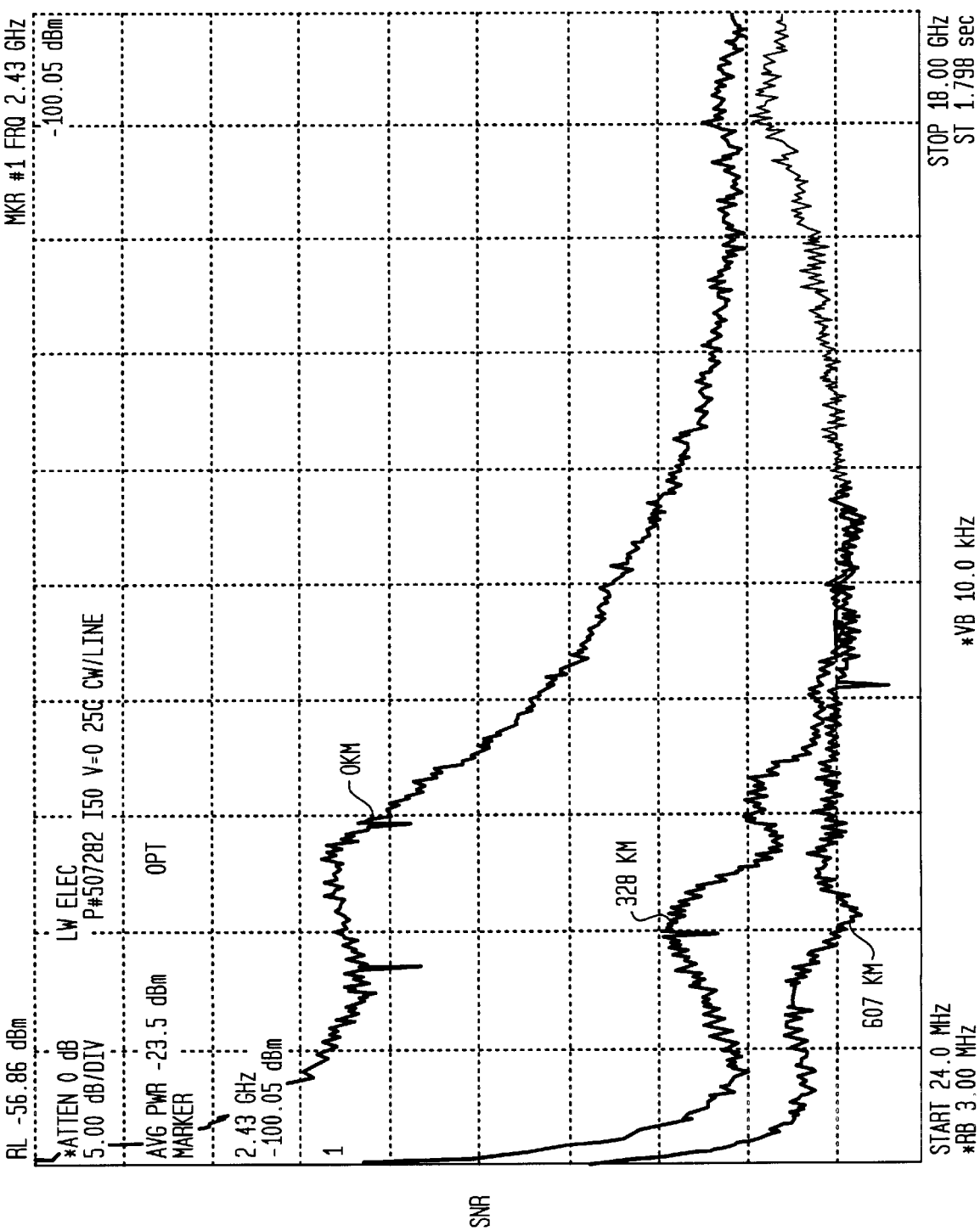
FIG. 4 shows a graphical representation of the signal-to-noise ratio for the EMILM device of FIG. 3 as a function of frequency for the same three transmission path lengths.

FIG. 4 shows a graphical representation of the signal-to-noise ratio (SNR) for the same EMILM device as FIG. 3 as a function of frequency for the same three transmission path lengths. As shown in FIG. 4, the signal-to-noise ratio degrades as the path length is increased.

Figure 5:
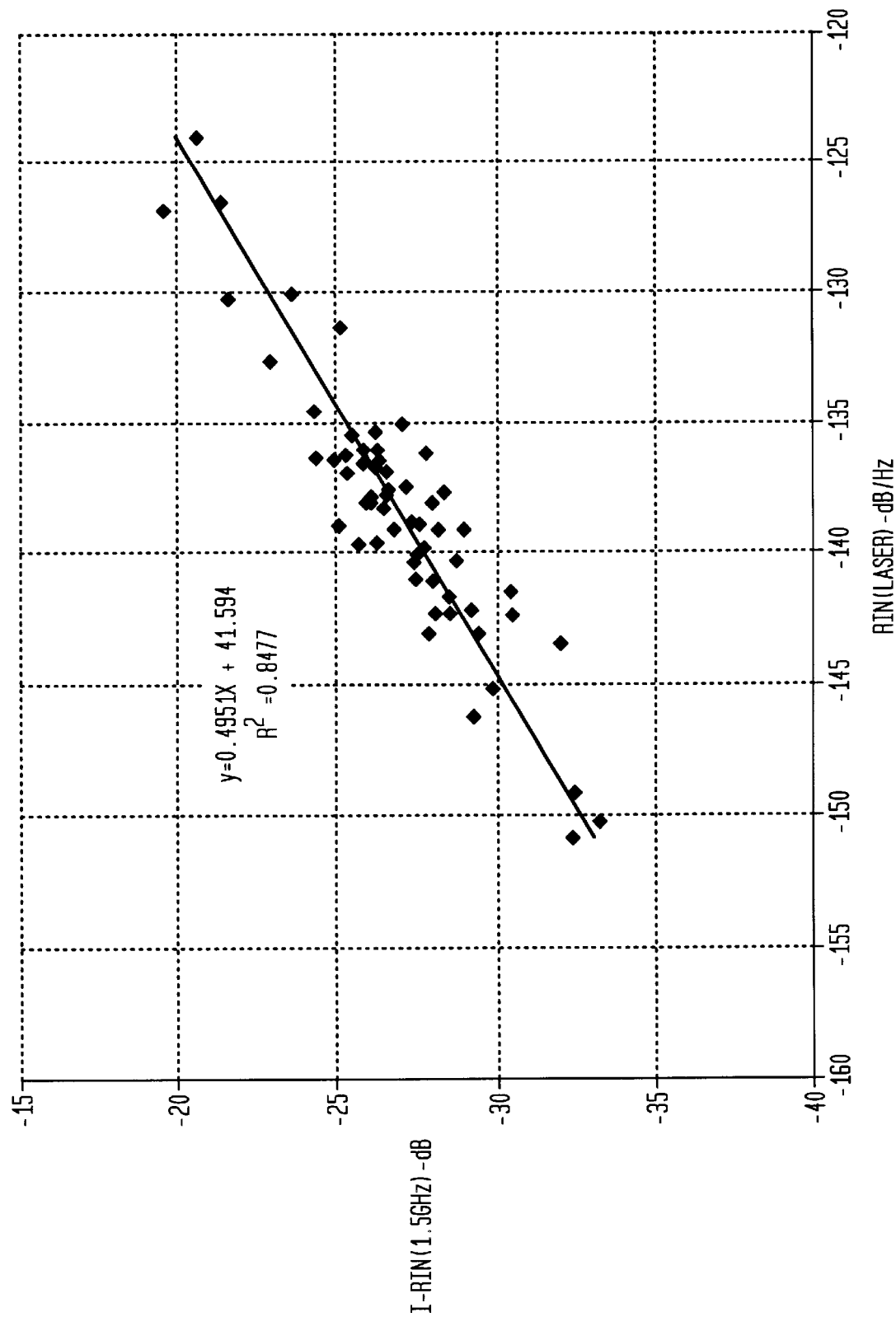
FIG. 5 shows a graphical representation of the relationship between the measured relative intensity noise (RIN) at the relaxation oscillation frequency $F_r$ at 0 km and the integrated relative intensity noise (I-RIN) after 681 km of single-mode fiber in the frequency range of 0 to 1.5 GHz for about 100 EMILM devices.

FIG. 5 shows a graphical representation of the relationship between the measured relative intensity noise (RIN) at the relaxation oscillation frequency $F_r$ at 0 km and the integrated relative intensity noise (I-RIN) after 681 km of single-mode fiber in the frequency range of 0 to 1.5 GHz for about 100 EMILM devices. These results show good correlation (i.e., a correlation coefficient R of 0.92) between the source noise at $F_r$ and the total noise after the signal travels 681 km. This indicates that the "on" state noise at the receiver will cause degradation in the BER performance, at a given fiber length, as the noise of the optical source increases.

Figure 6:
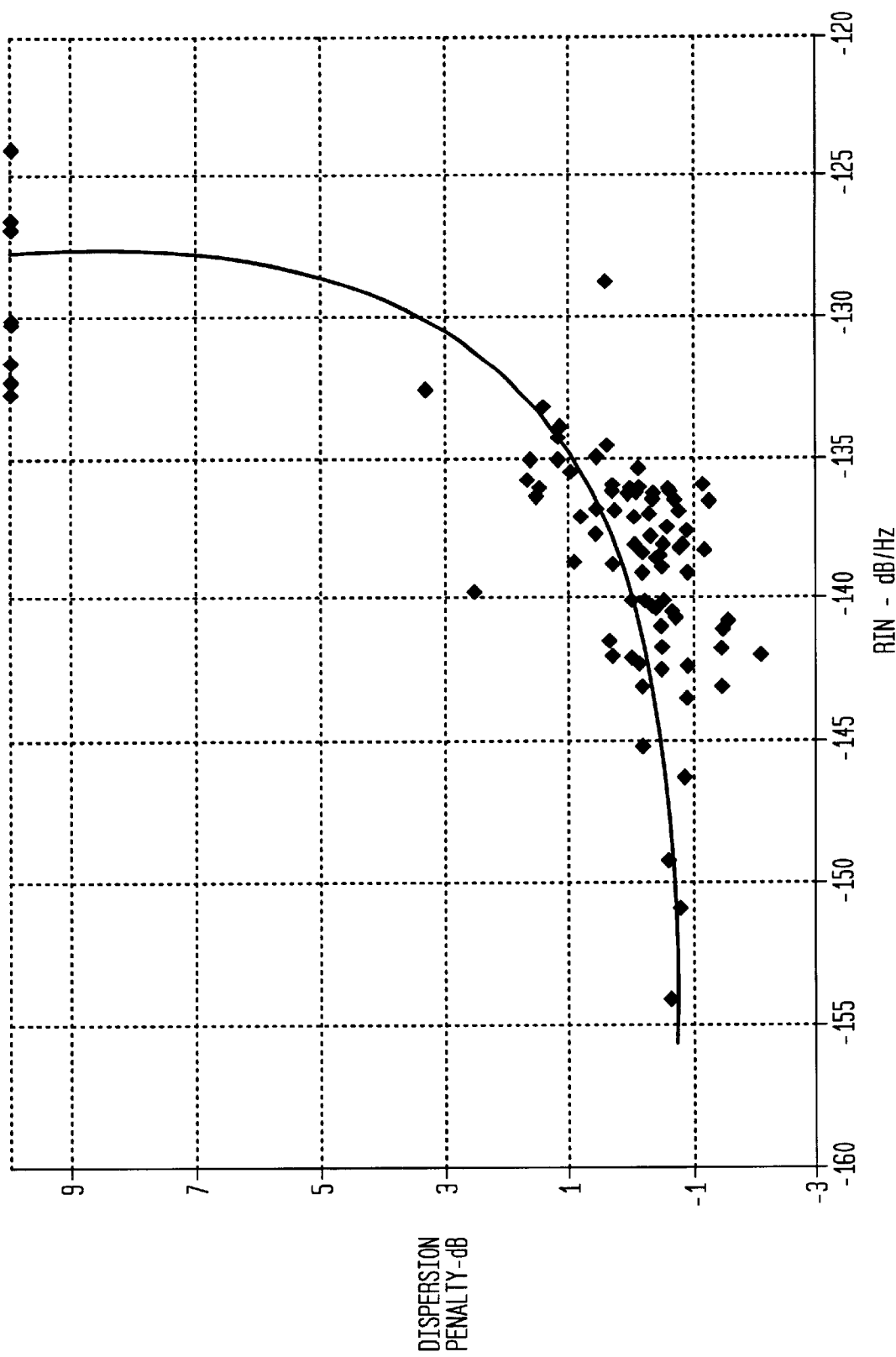
FIG. 6 shows a graphical representation of the measured dispersion penalty after 681 km of fiber for about 100 EMILM devices as a function of RIN at $F_r$.

FIG. 6 shows a graphical representation of the measured dispersion penalty after 681 km of fiber for about 100 EMILM devices as a function of RIN at $F_r$. Most of these devices have very low chirp. These results show that EMILM devices with low chirp and low RIN at $F_r$ have very low dispersion penalties, while sources with low chirp and RIN at $F_r$ greater than about −130 dB/Hz cause the BER limit to be exceeded.

These results demonstrate the efficacy of the present invention in which optical sources are selected for fiber optical communication systems based, at least in part, on noise measurements made outside of the system bandwidth. Such noise measurements can be made with relatively simple and inexpensive test configurations, such as that shown in FIG. 2, and the device selection process can be implemented without having to perform very complex and expensive BER testing of the whole system.

Although the present invention has been described in the context of fiber optical communication systems using EMILM devices as the optical sources and having bit rates on the order of 2.5 Gb/s and path lengths on the order of 640 km, the present invention can be applied to other fiber optical communications systems, including those with different optical sources and/or different bit rates and/or different path lengths. Different optical sources include externally modulated lasers (e.g., having lithium niobate modulators) and directly modulated lasers. Moreover, the selection process can be implemented with noise measures other than relative intensity noise measures and/or at frequencies other than the relaxation oscillation frequency $F_r$, as long as the frequency is outside of the bandwidth of the communication system.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for selecting individual optical source components for use in implementing a fiber optical communication system designed to have an operating bandwidth and to be implemented using a specified type of optical source, comprising the steps of:

(a) testing a plurality of optical source components of the specified type with respect to a noise measure at a frequency outside of the operating bandwidth of the communication system to determine a noise measure level for each optical source component; and (b) rejecting one or more of the optical source components for non-use in implementing the communication system based on the corresponding noise measure levels; and (c) selecting one or more of the optical source components for use in implementing the communication system based on the corresponding noise measure levels, wherein:

the optical source components are electro-absorption modulator isolated laser modules;

the frequency corresponds to a relaxation oscillation frequency of each optical source component between about 6 GHz and about 15 GHz;

the noise measure is a relative intensity noise (RIN) measure and the noise measure level of the optical source component is below −130 dB/Hz;

during step (a), each optical source component is operated in an unmodulated mode using a transmission path having a length of approximately 0 km and no optical amplifiers; and step (a) further comprises the step of characterizing optical source components with respect to chirp to determine a chirp level for each optical source component and step (c) comprises the step of selecting the optical source components based on both their chirp levels and their noise measure levels, wherein only those optical source components having a chirp level below a specified chirp level threshold are characterized with respect to the noise measure, wherein the specified chirp level threshold is about 0.2 Angstroms peak-to-peak.

2. A fiber optical communication system having an operating bandwidth, comprising one or more transmission paths, each transmission path comprising an optical source and an optical receiver with two or more optical fibers separated by one or more optical amplifiers between the optical source and the optical receiver, wherein, for each transmission path, the optical source has a noise measure level at a frequency outside of the operating bandwidth of the communication system that is below a specified threshold level, wherein:

the optical sources are electro-absorption modulator isolated laser modules;

at least one of the transmission paths has a total fiber length of at least about 640 km;

the noise measure is an RIN measure and the noise measure level corresponds to the noise measure level of the optical source if it were operating in an unmodulated mode for a transmission path having a length of approximately 0 km and no optical amplifiers;

the frequency corresponds to a relaxation oscillation frequency of each optical source between about 6 GHz and about 15 GHz;

the noise measure level of the optical source is below −130 dB/Hz; and the optical source has a chirp less than a specified threshold level, wherein the specified chirp level threshold is about 0.2 Angstroms peak-to-peak.

3. A method for selecting optical sources for use in a fiber optical communication system having an operating bandwidth, comprising the steps of:

(a) characterizing a plurality of optical sources with respect to a noise measure at a frequency outside of the operating bandwidth of the communication system to determine a noise measure level for each optical source; and (b) selecting one or more of the optical sources for use in the communication system based on the corresponding noise measure levels, wherein:

the optical sources are electro-absorption modulator isolated laser modules;

the frequency corresponds to a relaxation oscillation frequency of each optical source between about 6 GHz and about 15 GHz;

the noise measure is an RIN measure and the noise measure level of the optical source is below −130 dB/Hz;

during step (a), each optical source is operated in an unmodulated mode using a transmission path having a length of approximately 0 km and no optical amplifiers; and step (a) further comprises the step of characterizing optical sources with respect to chirp to determine a chirp level for each optical source and step (b) comprises the step of selecting the optical sources based on both their chirp levels and their noise measure levels, wherein only those optical sources having a chirp level below a specified chirp level threshold are characterized with respect to the noise measure, wherein the specified chirp level threshold is about 0.2 Angstroms peak-to-peak.

* * * * *